United States Patent [19]

Okada et al.

[11] Patent Number: 5,444,267
[45] Date of Patent: Aug. 22, 1995

[54] QUANTUM DEVICE UTILIZING THE QUANTUM EFFECT

[75] Inventors: Kenji Okada; Kiyoshi Morimoto, both of Osaka; Masaharu Udagawa, Tokyo; Koichiro Yuki, Neyagawa; Masaaki Niwa, Hirakata; Yoshihiko Hirai, Osaka; Juro Yasui, Toyonaka, all of Japan

[73] Assignee: Matsushita Electric Industrial Co., Ltd., Kadoma, Japan

[21] Appl. No.: 331,270
[22] Filed: Oct. 28, 1994

Related U.S. Application Data

[63] Continuation of Ser. No. 86,246, Jul. 1, 1993, abandoned.

[30] Foreign Application Priority Data

Jul. 3, 1992 [JP] Japan .................. 4-176597

[51] Int. Cl.$^6$ .................. H01L 29/161
[52] U.S. Cl. .................. 257/14; 257/23; 257/24; 257/25; 257/17
[58] Field of Search .................. 257/14, 23, 24, 25, 257/28, 192, 194, 623, 17

[56] References Cited

U.S. PATENT DOCUMENTS

| | | | |
|---|---|---|---|
| 4,751,194 | 6/1988 | Cibert et al. | 257/14 |
| 4,835,578 | 5/1989 | Ohtoshi et al. | 257/28 |
| 4,912,531 | 3/1990 | Reed et al. | 257/14 |
| 4,959,696 | 9/1990 | Frensley et al. | 257/25 |
| 4,989,052 | 1/1991 | Okada et al. | 257/194 |
| 4,996,570 | 2/1991 | Van Houten et al. | 257/194 |
| 5,032,877 | 7/1991 | Bate | 257/25 |
| 5,233,205 | 8/1993 | Usagawa et al. | 257/23 |

FOREIGN PATENT DOCUMENTS

| | | | |
|---|---|---|---|
| 0464834 | 8/1992 | European Pat. Off. | 257/194 |
| 3-196573 | 8/1991 | Japan | 257/14 |
| 00398 | 1/1988 | WIPO | 257/25 |

OTHER PUBLICATIONS

M. Reed et al., "Observation of Discrete Electronic States in a Zero–Dimensional Semiconductor Nanostructure", *Physical Review Letters*, vol. 60, No. 6, pp. 535–537 (Feb. 1988).

"Electron Wave Interference Device with Vertical Superlattices Working in Large Current Region", *Electronic Letters*, vol. 25, No. 11, pp. 728–730 (May 1989), Tsubaki et al.

K. Shimizu et al., "Fabrication of MOS Nanostructure by Employing Electron Beam Lithography and Anisotropic Wet Etching of Silicon", *Japanese Journal of Applied Physics*, vol. 30, No. 3A, pp. L415–L417 (Mar. 1991).

M. A. Foad et al., "Evaluation of sidewall damage in nanostructures etched in $CH_4/H_2$ and $SiCl_4$, by direct TEM observation", (1990), pp. 293–298, Proceedings of the Seventeenth International Symposium on Gallium Arsenide and Related Compounds, Jersey Channel Islands, Sep. 1990.

N. Yokoyama, "Resonant Tunneling Effects and Their Application to Three–Terminal Devices", *The Journal of the Institute of Electronics, Information and Communication Engineers*, vol. 72, No. 12, pp. 1387–1391 (Dec. 1989).

*Primary Examiner*—William Mintel
*Assistant Examiner*—Minhloan Tran
*Attorney, Agent, or Firm*—Ratner & Prestia

[57] ABSTRACT

A quantum device including a plate-like conductor part having a necking portion made by forming a first mask layer having a first strip portion on a conductor substrate; forming a second mask layer having a second strip portion on the conductor substrate; etching a region of the conductor substrate which is not covered with the first and second mask layers, by using the first and second mask layers as an etching mask, to form a plurality of first recess portions on a surface of the conductor substrate; selectively covering side faces of the plurality of first recess portions, and side faces of the first and second mask layers with a side wall film; selectively removing only the second mask layer; etching another region of the conductor substrate which is not covered with the first mask layer and the side wall film, by using the first mask layer and the side wall film as an etching mask, to form a plurality of second recess portions on the surface of the conductor substrate; selectively removing part of another region of the surface of the conductor substrate which is not covered with the first mask layer and the side wall film; and removing the first mask layer and the side wall film, to form the plate-like conductor part having the necking portion.

8 Claims, 8 Drawing Sheets

QUANTUM DEVICE UTILIZING THE QUANTUM EFFECT

This application is a continuation of application Ser. No. 08/086,246 filed Jul. 1, 1993, now abandoned.

BACKGROUND OF THE INVENTION

1. Field of the Invention

The present invention relates to a device for which a quantum effect is utilized, and a method of producing the same.

2. Description of the Related Art

Owing to the recent progress of the semiconductor technique, high integration of devices and miniaturization of device size have been progressing. Due to the miniaturization, it is necessary to develop a new device which has a structure different from that of the conventional transistor. For such a new device, a device for which a quantum effect is utilized has been studied (see THE JOURNAL OF THE INSTITUTE OF ELECTRONICS, INFORMATION AND COMMUNICATION ENGINEERS, Vol. 72, No. 12, pp. 1387–1391, December 1989).

In order to cause the quantum effect, developments of a technique for forming dots or strip wires each having a size of the order of an electron wave-length, and a technique for constituting a circuit by coupling the dots and the strip wires are required.

For a quantum device whose operation is based on the quantum effect, various devices are now being developed. Especially, a device for controlling the electron transfer by utilizing the resonant tunneling effect has been developed. The quantum device for which the resonant tunneling effect is utilized includes a minute conductor region in which the energy states which can be taken by electrons are quantized, and a pair of conductor regions (electrodes) adjacent to the minute conductor region via a thin barrier film through which electrons can tunnel. Such a quantum device is disclosed, for example, in U.S. Pat. No. 4,912,531 (Reed et al.).

In order to realize the above quantum device, a technique for forming a microstructure with good reproducibility is required. A conventional quantum device is produced by laminating a plurality of different kinds of thin compound semiconductor films on a semiconductor substrate. As a result, in the quantum device, electrons move freely in a direction parallel to the main plane of the substrate, and electrons are confined in the quantized region in another direction perpendicular to the main plane of the substrate.

However, in the above prior art, it is difficult to form a region which has a very small thickness which is measured along a direction parallel to the main plane of the substrate.

SUMMARY OF THE INVENTION

The method of producing a quantum device including a plate-like conductor pert having a necking portion of this invention, includes the steps of: (a) forming a first mask layer having a first strip portion, on a conductor substrate; (b) forming a second mask layer having a second strip portion which crosses the first strip portion, on the conductor substrate; (c) etching a region of the conductor substrate, the region not being covered with the first and second mask layers, by using the first and second mask layers as an etching mask, to form a plurality of first recess portions on a surface of the conductor substrate; (d) selectively covering side faces of the plurality of first recess portions, and side faces of the first and second mask layers with a side wall film; (e) selectively removing only the second mask layer, the first mask layer and the side wall film being left unremoved; (f) etching another region of the conductor substrate, the region not being covered with the first mask layer and the side wall film, by using the first mask layer and the side wall film as an etching mask, to form a plurality of second recess portions on the surface of the conductor substrate; (g) selectively removing part of another region of the surface of the conductor substrate, the region being not covered with the first mask layer and the side wall film; and (h) removing the first mask layer and the side wall film, to form the plate-like conductor part having the necking portion at the conductor substrate.

In one embodiment, the step (g) includes: a step of selectively oxidizing another region of the surface of the conductor substrate, the region being not covered with the first mask layer and the side wall film, to form an oxide film; and a step of removing the oxide film.

In one embodiment, the step (g) includes: a step of selectively nitriding another region of the surface of the conductor substrate, the region being not covered with the first mask layer and the side wall film, to form a nitride film; and a step of removing the nitride film.

In one embodiment, the step (g) includes a step of selectively etching another region of the surface of the conductor substrate, the region being not covered with the first mask and the side wall film.

In one embodiment, the method further includes the steps of: forming a pair of tunnel insulation films at least on side faces of the necking portion; and forming a pair of conductive members which sandwich the necking portion via the pair of tunnel insulation films.

In one embodiment, the method further includes the steps of: forming a gate insulation film at least on an upper face of the necking portion; and forming a gate electrode on the gate insulation film.

In another aspect of the invention, a method of producing a quantum device including a plate-like conductor part having a necking portion is provided. The method includes the steps of: (a) forming an insulation film on a conductor substrate; (b) forming a multilayer film having a conductive layer as a bottom layer, on the insulation film; (c) patterning the multilayer film, to form a first mask layer having a first strip portion on the insulation film; (d) forming a first side wall film on side faces of the first strip portion; (e) forming a second mask layer having a second strip portion which crosses the first strip portion on the insulation film; (f) etching regions of the insulation film and the conductor substrate, the regions not being covered with the first and second mask layers and the first side wall film, by using the first and second mask layers and the first side wall film as an etching mask, to form a plurality of first recess portions on a surface of the conductor substrate; (g) selectively covering at least side faces of the plurality of first recess portions with a second side wall film; (h) selectively removing only second mask layer, the first mask layer and the first and second side wall films being left unremoved; (i) etching another region of the conductor substrate, the region not being covered with the first mask layer and the first and second side wall films, by using the first mask layer and the first and second side wall films as an etching mask, to form a plurality of second recess portions on the surface of the conductor substrate; (j) selectively removing part of a region of the surface of the conductor substrate, the region not being covered with the first mask layer and the first and second side wall films; and (k) removing the first and second side wall films, to form the plate-like conductor part having the necking portion at the conductor substrate.

In one embodiment, the step (j) includes: a step of selectively oxidizing another region of the surface of the conductor substrate, the region being not covered with the first mask layer and the first and second side wall films, to form an oxide film; and a step of removing the oxide film.

In one embodiment, the step (j) includes: a step of selectively nitriding another region of the surface of the conductor substrate, the region being not covered with the first mask layer and the first and second side wall films, to form a nitride film; and a step of removing the nitride film.

In one embodiment, the step (j) includes a step of selectively etching another region of surface of the conductor substrate, the region being not covered with the first mask and the first and second side wall films.

In another aspect of the invention, a quantum device is provided. The quantum device includes: a conductor substrate having a main face; and a plate-like conductor part having two side faces, the side faces being perpendicular to the main face of the conductor substrate, the side faces being parallel to each other, wherein the plate-like conductor part includes a necking portion having a width smaller than a distance between the two side faces, and energy states of electrons in the necking portion are quantized in a direction perpendicular to the two side faces.

In one embodiment, the quantum device further includes: a pair of tunnel insulation films formed at least on side faces of the necking portion; and a pair of conductive members which sandwich the necking portion via the pair of tunnel insulation films.

In one embodiment, the quantum device further includes: a gate insulation film formed at least on an upper face of the necking portion; and a gate electrode formed on the gate insulation film.

In one embodiment, the gate electrode is self-aligned with an upper face of the plate-like conductor Thus, the invention described herein makes possible the advantages of (1) providing a device for which a quantum effect is utilized, and (2) providing a method of producing a quantum device including steps capable of forming a necking portion having a very small thickness which is measured along a direction parallel to the main plane of a substrate.

These and other advantages of the present invention will become apparent to those skilled in the art upon reading and understanding the following detailed description with reference to the accompanying figures.

DESCRIPTION OF THE PREFERRED EMBODIMENTS

Hereinafter, a method of producing a quantum device according to a first example of the invention will be described with reference to the relevant figures.

FIGS. 1A to 1C and FIGS. 2A to 2F show the method of producing a quantum device according to the first example of the invention. The production flow will be described below.

Figure 1A:
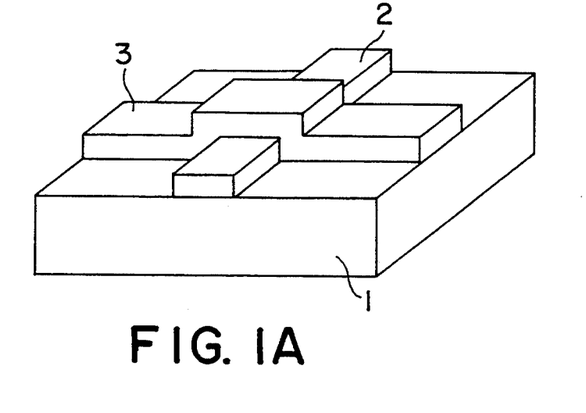
FIGS. 1A to 1C are perspective views illustrating a flow for producing a quantum device according to a first example of the invention.
Figure 1B:
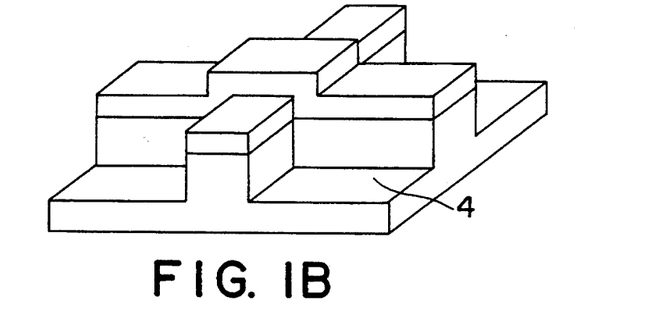
Figure 1C:
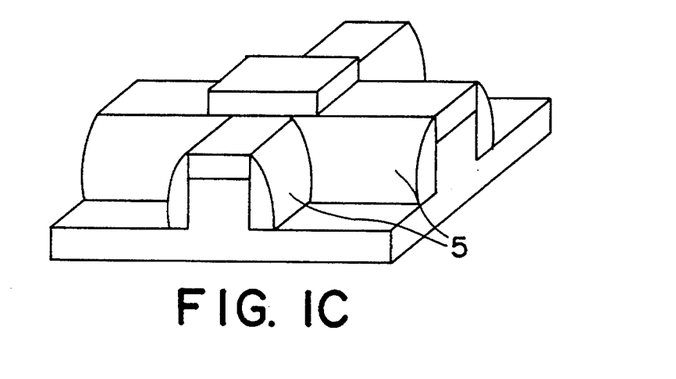

In the step shown in FIG. 1A, a nitride film (thickness: 100 nm) 2 like a strip wire (width: 500 nm) is formed on a silicon substrate 1. An oxide film (thickness: 100 nm) 3 like a strip wire (width: 500 nm) is also formed on the silicon substrate 1. The nitride film 2 and the oxide film 3 are formed substantially perpendicular to each other. In the step shown in FIG. 1B, using the nitride film 2 and the oxide film 3 as a mask, the silicon substrate 1 is etched by a dry etching technique, so as to form a first recess portion (depth: 300 nm) 4. For the etchant, $SF_6$ is used. In the step shown in FIG. 1C, a nitride film (thickness: 100 nm) is first deposited over the entire surface. Then, the nitride film is etched back by anisotropic etching, so as to form a side wall structure 5 of the nitride film on the side walls of the nitride film 2, the oxide film 3, and the first recess portion 4. Thereafter, the oxide film 3 is removed away by an etching method.

Figure 2A:
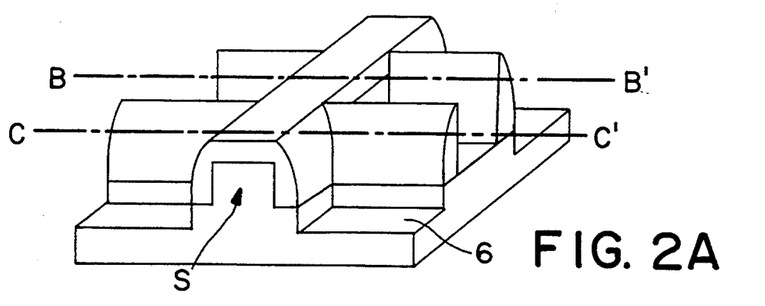
FIGS. 2A to 2F are perspective and cross-sectional views illustrating the flow for producing the quantum device according to the first example of the invention.
Figure 2B:
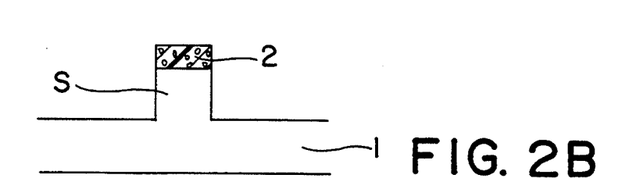
Figure 2C:
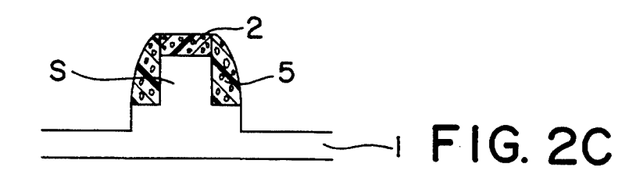
Figure 2D:
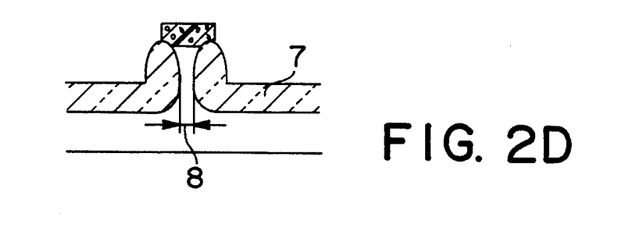
Figure 2E:
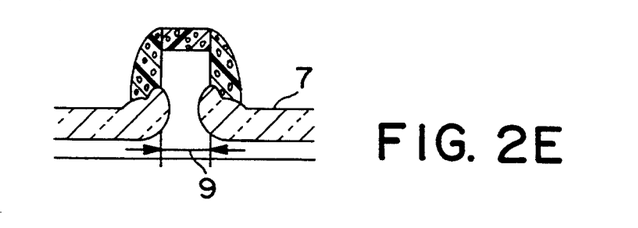
Figure 2F:
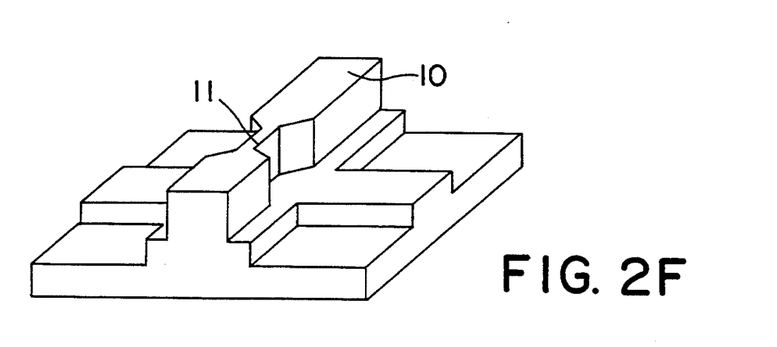

In the step shown in FIG. 2A, by using the nitride film 2 and the side wall structure 5 as a mask, the exposed portion of the silicon substrate 1 is etched by the dry etching technique, so as to form a second recess portion (depth: 250 nm) 6. By this etching step, a silicon stripe 5 is formed. At the step of FIG. 2A, the cross-sectional view taken along line B-B' is shown in FIG. 2B, and the cross-sectional view taken along line C-C' is shown in FIG. 2C. As is shown in FIG. 2B, An the portion where the oxide film 3 has been formed at the step of FIG. 1A, the nitride film 2 exists on the silicon stripe S, and nothing exists on the side walls of the silicon stripe S. As is shown in FIG. 2C, in the portion where the oxide film 3 has not been formed at the step of FIG. 1A, the nitride film 2 exists on the silicon stripe S, and the side wall structure 5 is positioned on the side walls of the silicon stripe S. Thereafter, a thermal oxidation process is performed, so as to form a thermal oxide film (thickness: 220 nm) 7. The thermal oxidation process is performed in a pyrogenic atmosphere, at a temperature of 1000° C. for about 50 minutes. After the thermal oxidation process, the resulting cross-sectional view taken along line B–B' is shown in FIG. 2D, and the resulting cross-sectional view taken along line C–C' is shown in FIG. 2E. Specifically, since the side wall structure 5 does not exist on the side walls of the silicon stripe S in the B–B' cross section, the oxide film formation progresses from the side wall portions of the silicon stripe S. As a result, an extremely thin width 8 of the silicon stripe S in the B–B' cross section is obtained, as is shown in FIG. 2D. In the C–C' cross section, since the side wall structure 5 exists on the side walls of the silicon stripe S, the oxidation progresses from a portion of the silicon stripe S lower than the side wall structure 5. As a result, a relatively thick width 9 in the C–C' cross section is obtained. FIG. 2F shows the resulting silicon surface structure excluding the oxide films and the nitride films. As is shown An FIG. 2F, a silicon strip wire 10 having a necking portion (the thickness thereof which is measured along a lateral direction: 60 nm) 11 is obtained. Even in a case where the strip sizes (widths) of the nitride film 2 and the oxide film 3 are those not capable of attaining the quantum effect, a small size capable of attaining the quantum effect can be realized in the necking portion 11 according to this example. In another case where the strip sizes of the nitride film 2 and the oxide film 3 are those capable of attaining the quantum effect, quantum strip wires having various widths can be produced according to this example.

As described above, according to this example, a method for easily producing a quantum device having a lateral size capable of attaining the quantum effect can be obtained.

In this example, the thermal oxidation is performed so as to form the thermal oxide film 7 for obtaining the extremely thin width 8 in the B–B' cross section. Alternatively, silicon may be etched by wet etching by using a mixture of hydrofluoric acid and nitrate as the etchant so as to reduce the width 8 in the B–B' cross section.

In this example, thermal oxidation is performed for forming the thermal oxide film 7 so as to obtain the width 8 in the B–B' cross section. Alternatively, the width 8 may be reduced by the combination of the wet etching and the thermal oxidation.

Hereinafter, a method of producing a quantum device according to a second example of the invention will be described with reference to the relevant figures.

Figures 3A, 3B:
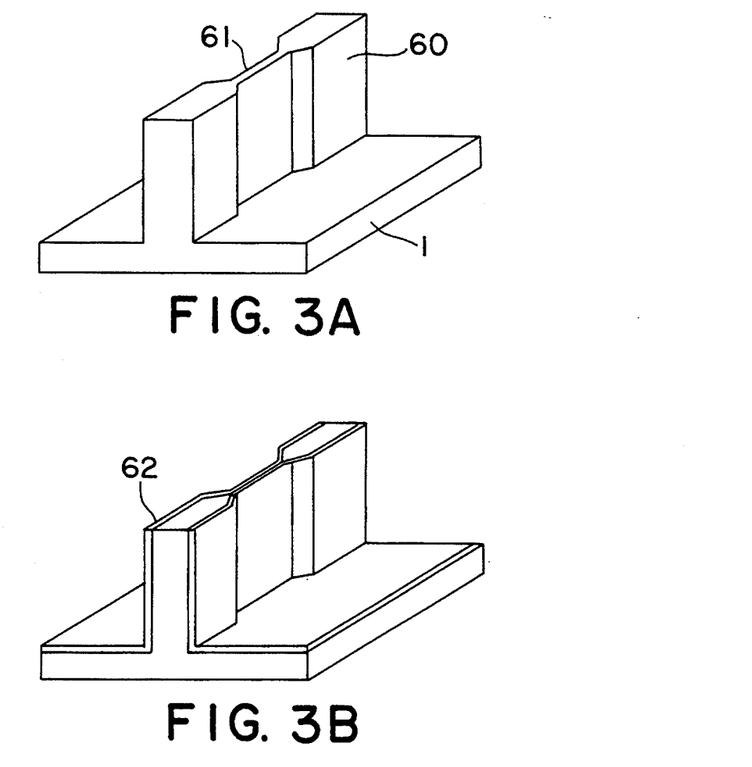
FIG. 3A to 3C are perspective views illustrating a flow for producing a quantum device according to a second example of the invention.
Figure 3C:
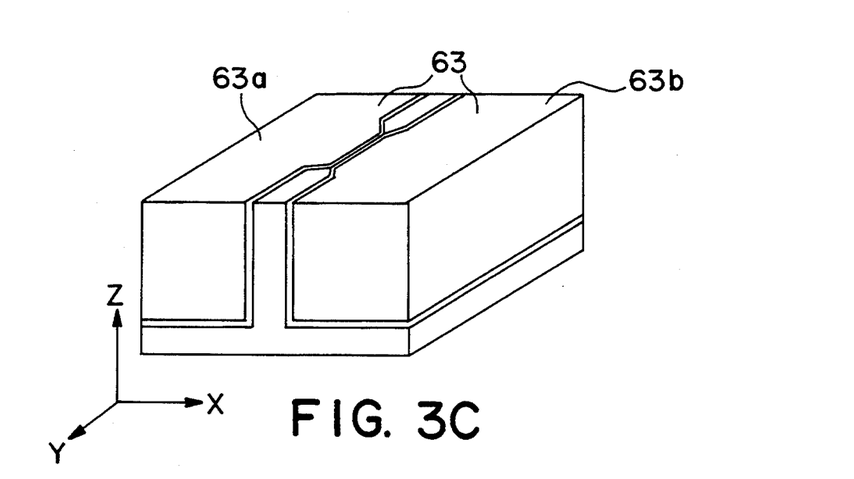

FIGS. 3A to 3C illustrate the method of producing a quantum device according to the second example of the invention. FIGS. 4A to 4D illustrate the principle of the operation of the quantum device in the second example of the invention. The production flow is described below.

In the step shown in FIG. 3A, a plate-like silicon 60 including a necking portion (thickness: 60 nm) 61 is formed on a silicon substrate 1 by the method described in the above first example. In the step shown in FIG. 3B, a thermal oxidation is performed, so as to form a thin thermal oxide film (thickness: 2 nm) 62 around the plate-like silicon 60 and the necking portion 61, and on the silicon substrate 1. In the step shown in FIG. 3C, a single crystal silicon 63 is formed and then a planarization is performed. The left portion of the single crystal silicon 63 functions as a first electrode 63a. The right portion of the single crystal silicon 63 functions as a second electrode 63b.

As seen from FIG. 3C, a structure including, along the x direction, the single crystal silicon 63, the 2-nm tunnel oxide film 62, the necking portion (substrate 1) 61, the 2-nm tunnel oxide film 62, and the single crystal silicon 63 is formed. The energy states of electrons in the necking portion 61 are quantized in the thickness direction x, so that is has a two-dimensional structure. A thickness of 2 nm of the oxide film 62 is sufficient for electrons to tunnel through the oxide film 62.

Figure 4A:
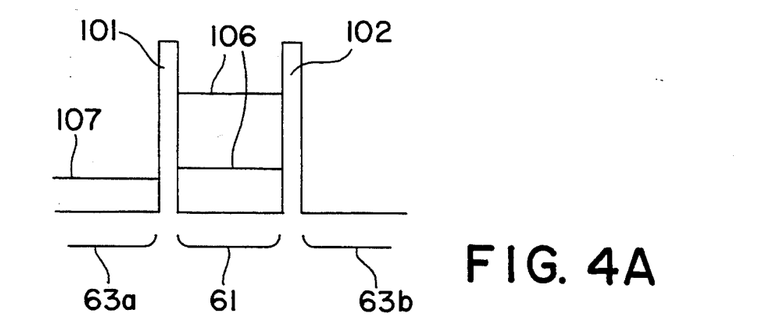
FIGS. 4A to 4C are diagrams showing the operation principle of the quantum device according to the second example of the invention.
Figure 4B:
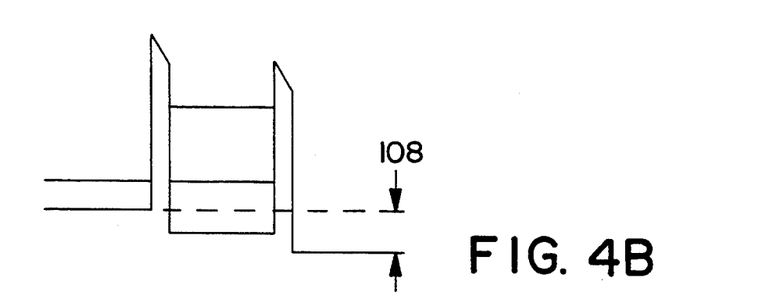
Figure 4C:
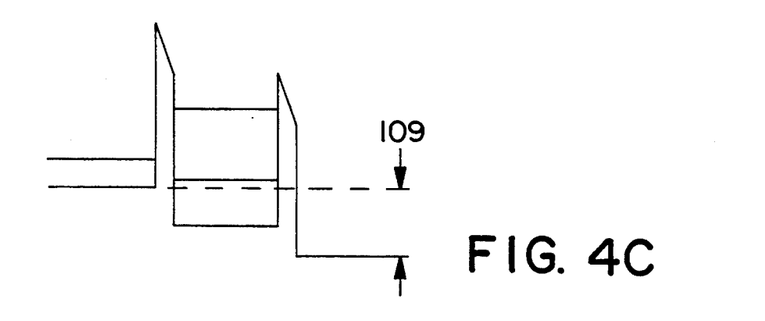

FIGS. 4A to 4C are potential diagrams in the cross section along the x direction in the region including the necking portion in FIG. 3C. The operation of the quantum device as shown in FIG. 3C is described with reference to FIGS. 4A to 4D.

FIG. 4A shows a state where the potential difference between the first electrode 63a and the second electrode 63b is 0. FIG. 4B shows a state where a first potential difference 108 is applied between the first electrode 63a and the second electrode 63b. FIG. 4C shows a state where a second potential difference 109 is applied between the first electrode 63a and the second electrode 63b.

In FIG. 4A, the first electrode 63a and the second electrode 63b are conductive regions of the single crystal silicon 63 in FIG. 3C, and each have a three-dimensional structure, and have a continuous band structure. There is a first potential barrier 101 between the first electrode 63a and the necking portion 61. Similarly, a second potential barrier 102 exists between the necking portion 61 and the second electrode 63b. The Fermi level in the first electrode 63a is defined as a Fermi level 107 in the first electrode 63a. In the necking portion (resonant layer) 61, the width thereof in the x direction is sufficiently small, so that it is regarded as having a two-dimensional structure on the basis of the quantum theory. The band structure in the necking portions 61 is different from that of the first and second electrodes 63a end 63b. For simplicity, it is presumed herein that values of the Fermi level 107 at which a probability that carriers (electrons) transmit from the first electrode 63a to the second electrode 63b due to the resonant tunneling effect is 1 are represented by quantized levels 106 in the necking portion 61.

In the state shown in FIG. 4A, since the Fermi level in the first electrode 63a is not equal to the quantized levels 106 in the necking portion 61, the resonant tunneling effect does not take place. Thus, the tunneling of the carriers from the first electrode 63a to the second electrode 63b does not occur. Next, in the state of FIG. 4B where the first potential difference 108 between the first and the second electrodes 63a and 63b is applied so that the Fermi level 107 in the first electrode 63a is equal to either one of the quantized levels 106 in the necking portion 61, the tunneling of carriers from the first electrode 63a to the second electrode 63b due to the resonant tunneling effect occurs, thereby causing a current to flow. In the state shown in FIG. 4C, the potential difference between the first and the second electrodes 63a and 63b is increased, but has not reached the potential difference between the first and the second electrodes 63a and 63b at which the Fermi level 109 in the first electrode 63a is equal to the other one of the quantized levels 106 in the necking portion 61. Specifically, when the second potential difference 109 between the first and the second electrodes 63a and 63b is applied as is shown in FIG. 4C, the current does not flow.

Figure 4D:
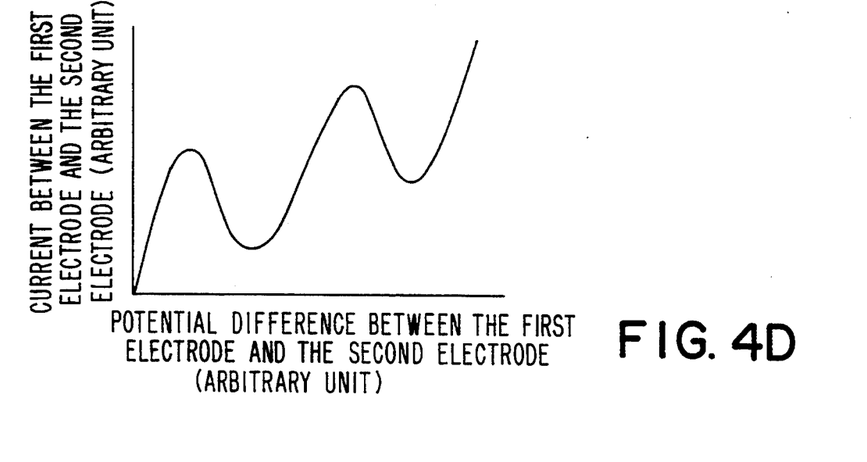
FIG. 4D is a graph schematically illustrating the relationship between the amount of current and the potential difference between a first and a second electrodes.

FIG. 4D schematically shows the amount of current while the potential difference between the first and the second electrodes 63a and 63b is continuously increased from zero. In FIG. 4D, the negative resistance is exhibited. By utilizing the negative resistance, a device having a new function in addition to the conventional ON-/OFF function of a MOSFET can be produced.

In this example, only the necking portion 61 is sufficiently thin for the quantization in the thickness direction, and the other portions of the plate-like silicon 60 are formed to be sufficiently thick not for the quantization. As a result, as is shown in FIG. 3C, even when the single crystal silicon 63 is formed entirely around the plate-like silicon 60, the region where the resonant tunneling takes place can be limited to the necking portion 61. Therefore, during the formation of the single crystal silicon 63, the restrictions for production are reduced. In addition, when a quantum well is produced into a zero dimension in the resonant tunneling effect, the quantum well can be produced only by giving attention to the width in the y direction and the depth in the z direction of the necking portion 61.

As described above, according to this example, a method of producing a quantum device by which a quantum device buying a size sufficient for attaining the resonant tunneling effect can readily be produced.

Next, a method of producing a quantum device according to a third example of the invention will be described with reference to the relevant figures.

FIGS. 5A to 5D illustrate the method for producing a quantum device in the third example of the invention. The production flow will be described below.

Figure 5A:
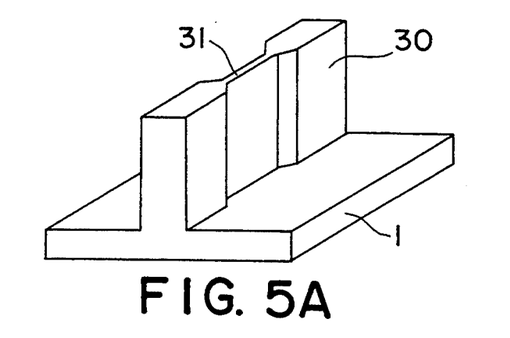
FIGS. 5A to 5D are perspective views illustrating a flow for producing a quantum device according to a third example of the invention.
Figure 5B:
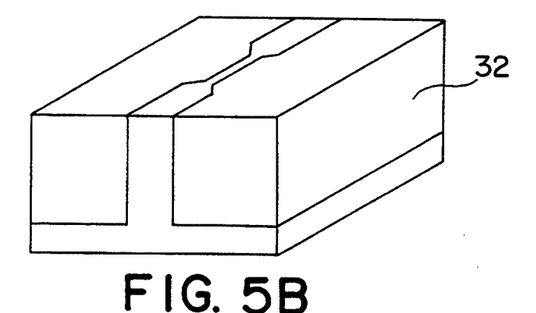
Figure 5C:
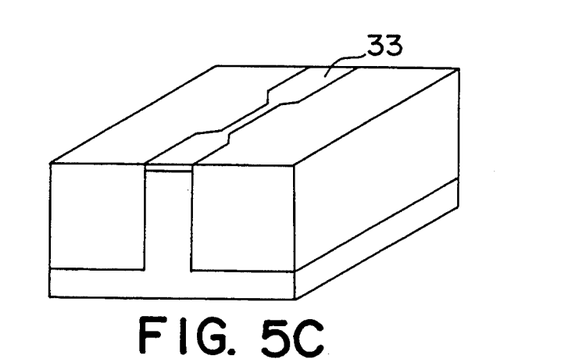
Figure 5D:
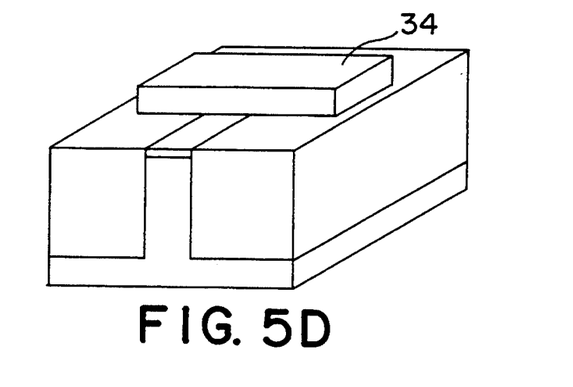

In the step shown in FIG. 5A, a silicon strip wire 30 having a necking portion (thickness: 60 nm) 31 is formed on a silicon substrate 1 by method described in the first example of the invention. In the step shown in FIG. 5B, an insulator is formed, and patterned to expose the surface of the silicon strip wire 30. Thus, an insulating film (thickness: 500 nm) 32 is obtained. In the step shown in FIG. 5C, a thermal oxidation is performed to form an oxide film (thickness: 10 nm) 33. In the step shown in FIG. 5D, polycrystalline silicon is deposited, and patterned into an electrode shape. Thus, a control electrode 34 is formed. In this example, by controlling the potentials of the control electrode 34 and the silicon substrate 1 which are connected via the silicon strip wire 30 and the oxide film 33, a depletion region, a reversed region, or a storage region can be formed in the silicon strip wire 30. Therefore, electrodes are formed at both ends of the strip wire, and a potential is applied, so that a current can be caused to flow. The amount of current can be controlled changing the electrical potential of the control electrode 34.

As described above, according to this example, a method by which a quantum device can readily be produced can be obtained.

Next, a method of producing a quantum device according to a fourth example of the invention will be described with reference to the relevant figures.

FIGS. 6A to 6C, 7A to 7C, and 8A to 8E illustrate the method of producing a quantum device according to the fourth example of the invention. The production flow will be described.

Figure 6A:
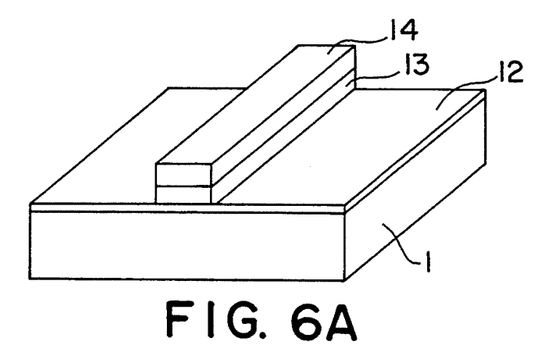
FIGS. 6A to 6C are perspective views illustrating a flow for producing a quantum device according to a fourth example of the invention.
Figure 6B:
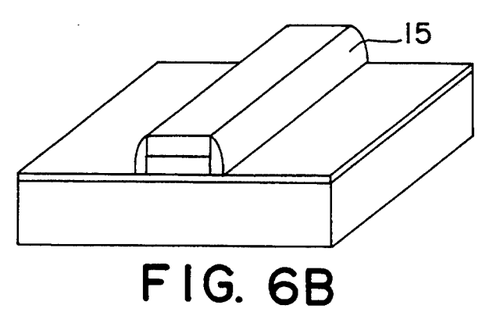
Figure 6C:
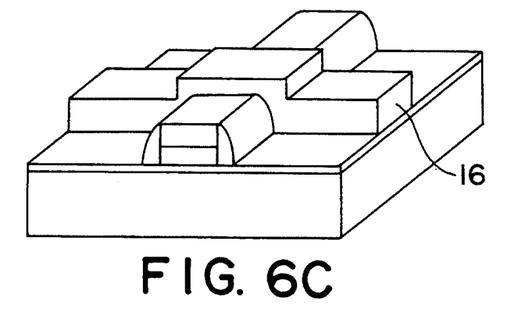

In the step shown in FIG. 6A, after a gate oxide film (thickness: 10 nm) 12 is formed on a silicon substrate 1, polycrystalline silicon (thickness: 250 nm) 13 and a nitride film (thickness: 100 nm) 14 are formed and patterned into predetermined shapes. The patterned polycrystalline silicon 13 will serve as a gate electrode. In the step shown in FIG. 6B, a nitride film is first deposited over the silicon substrate 1, end then etched back by anisotropic etching, so as to form a first side wall structure 15 of the nitride film at the side walls of the polycrystalline silicon 13 and the nitride film 14. In the step shown in FIG. 6C, an oxide film is first deposited over silicon substrate 1 and then patterned by anisotropic etching, so as to form an oxide stripe (thickness: 100 nm) 16.

Figure 7A:
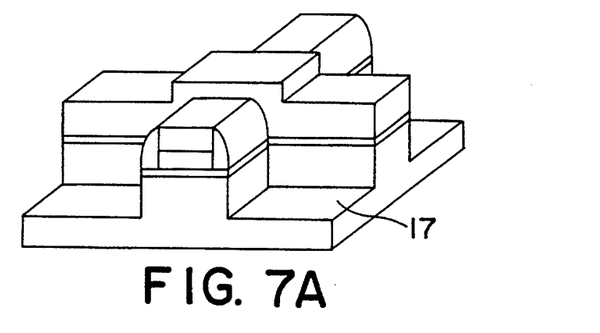
FIGS. 7A to 7C are perspective views illustrating the flow for producing the quantum device according to the fourth example of the invention.
Figure 7B:
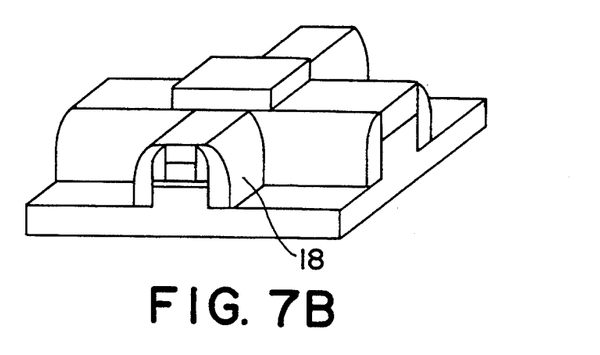

In the step shown in FIG. 7A, the silicon substrate 1 is etched by using the nitride film 14, the oxide stripe 16, and the first side wall structure 15 as a mask, so as to form first recess portions 17. In the step shown in FIG. 7B, a nitride film is first deposited and then etched back by anisotropic etching, so as to form a second side wall structure 18 of the nitride film at the side walls of the nitride film 14, the oxide stripe 16, the first side wall structure 15, and the first recess portion 17. In the step shown in FIG. 7C, the oxide stripe 16 is removed, and silicon etching is performed by using the nitride film 14, the first side wall structure 15 and the second side wall structure 18 as a mask, so as to form second recess portions 19.

Figure 7C:
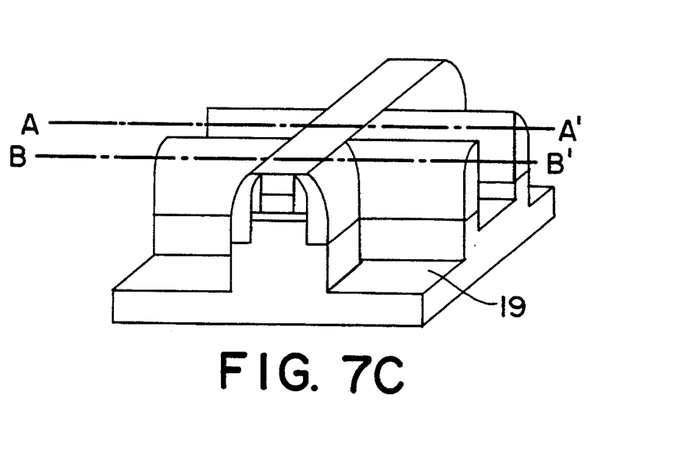
Figure 8A:
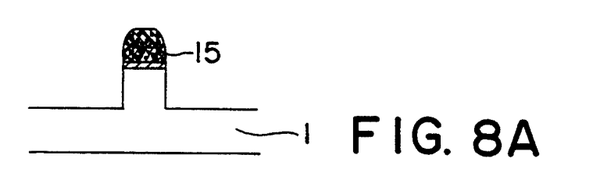
FIGS. 8A to 8E are cross-sectional and perspective views illustrating the flow for producing the quantum device according to the fourth example of the invention.
Figure 8B:
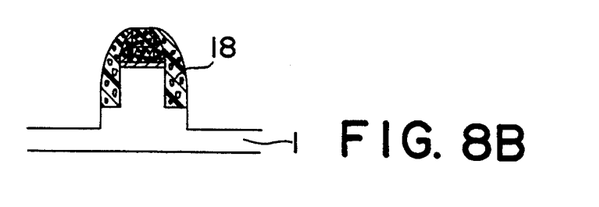
Figure 8C:
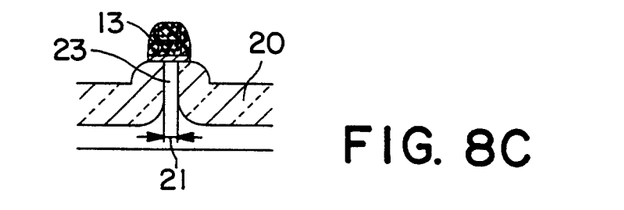
Figure 8D:
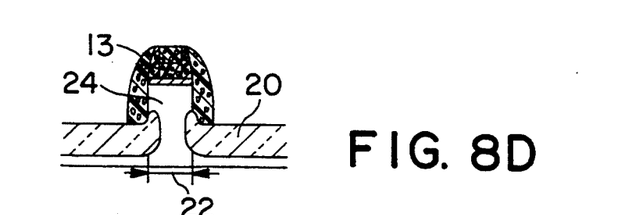
Figure 8E:
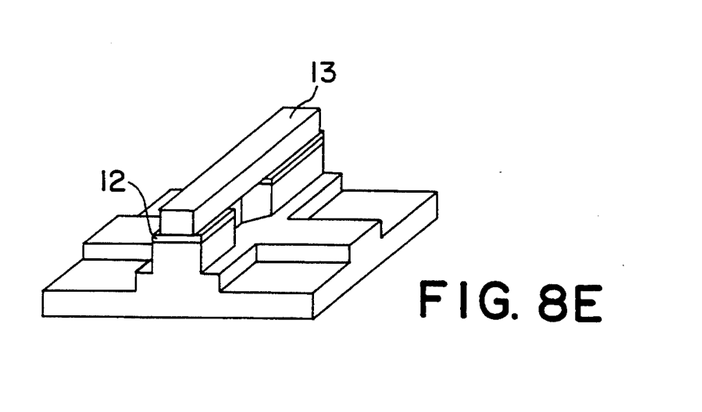

FIG. 8A shows a cross-sectional view taken along line A-A' in FIG. 7C. FIG. 8B shows cross-sectional view taken along line B-B' in FIG. 7C. Specifically, in the A-A' cross section, the silicon side wall portions are exposed. In the B-B' cross section, the silicon side wall portions are covered with the second side wall structure 18. In steps shown in FIGS. 8C and 8D, a thermal oxidation is performed, so as to form a thermal oxide film (thickness: 220 nm) 20. FIG. 8C shows the A-A' cross section after the thermal oxidation. In the A-A' cross section, the oxidation progresses from the silicon side wall portions, whereby a necking portion 23 having a width 21 is obtained. FIG. 8D shows the B-B' cross section after the thermal oxidation. In the B-B' cross section, a silicon strip wire 24 having a width 22 which is larger than the width 21 is obtained. FIG. 8E shows The perspective view of the structure after the formation of the thermal oxide film 20 in the steps of FIGS. 8C and 8D. Note that in FIG. 8E, for simplicity, the structure is shown without the nitride films and the thermal oxide film 20.

In this example, the gate electrode (polycrystalline silicon 13) is formed in a self-alignment with the necking portion 23 and the silicon strip wire 24. This means that it is unnecessary to performing any additional step for forming an electrode after the formation steps of the necking portion and the silicon strip wire. Thus, this example is superior to the first example.

As described above, according to this example, a method by which a quantum device having a size capable of attaining the quantum effect can easily be produced is obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A quantum device comprising:
   a conductor substrate having a main face;
   a plate-like conductor part formed on said main face of said conductor substrate as a portion of said conductor substrate, said plate-like conductor part having two side faces which are perpendicular to said main face of said conductor substrate, said side faces being parallel to each other, wherein said plate-like conductor part includes a necking portion having a width smaller than a distance between two side faces;

a pair of tunnel insulation films formed at least on side faces of said necking portion; and a pair of conductive members which sandwich said necking portion via said pair of tunnel insulation films, wherein said width of said necking portion is sufficiently thin to attain the quantization of energy states of electrons in said necking portion in a direction perpendicular to said two side faces.

2. A quantum device according to claim 1, wherein said conductor substrate and said plate-like conductor part are made of silicon.

3. A quantum device comprising:

a conductor substrate having a main face;

a plate-like conductor part formed on said main face of said conductor substrate as a portion of said conductor substrate, said plate-like conductor part having two side faces which are perpendicular to said main face of said conductor substrate, said side faces being parallel to each other, wherein said plate-like conductor part includes a necking portion having a width smaller than a distance between said two side faces;

a gate insulation film formed at least on an upper face of said necking portion; and a gate electrode formed on said gate insulation film, wherein said width of said necking portion is sufficiently thin to attain the quantization of energy states of electrons in said necking portion in a direction perpendicular to said two side faces.

4. A quantum device according to claim 3, wherein said gate electrode is self-aligned with an upper face of said plate-like conductor part.

5. A quantum device comprising:

a conductor substrate having a main face;

a plate-like conductor part formed on said main face of said conductor substrate as a portion of said conductor substrate, said plate-like conductor part having two side faces which are perpendicular to said main face of said conductor substrate, said side faces being parallel to each other, wherein said plate-like conductor part includes a necking portion having a width smaller than a distance between said two side faces;

a pair of insulating layers formed at least on side faces of said necking portion;

a silicon oxide film formed at least on an upper face of said necking portion; and a control gate formed on said silicon oxide film, wherein said width of said necking portion is sufficiently thin to attain the quantization of energy states of electrons in said necking portion in a direction perpendicular to said two side faces.

6. A quantum device comprising:

a conductor substrate having a main face;

a plate-like conductor part formed on said main face of said conductor substrate as a portion of said conductor substrate, said plate-like conductor part having two side faces which are perpendicular to said main face of said conductor substrate, said side faces being parallel to each other, wherein said plate-like conductor part includes a necking portion having a width smaller than a distance between said two side faces, said width of said necking portion being sufficiently thin to attain the quantization of energy states of electrons in said necking portion in a direction perpendicular to said two side faces; and a pair of tunnel insulation films formed at least on side faces of said necking portion.

7. A quantum device according to claim 6, wherein a thickness of said pair of tunnel insulation films is sufficiently thin for electrons to pass therethrough by the tunneling effect.

8. A quantum device according to claim 6, wherein said conductor substrate and said plate-like conductor part are made of silicon.

* * * * *

UNITED STATES PATENT AND TRADEMARK OFFICE
CERTIFICATE OF CORRECTION

PATENT NO.    : 5,444,267
DATED         : August 22, 1995
INVENTOR(S)   : Okada et al.

It is certified that error appears in the above-identified patent and that said Letters Patent is hereby corrected as shown below:

On cover page, item [57] the Abstract, should read:

--A quantum device including a plate-like conductor part having a necking portion and a method of producing the same are disclosed. The method includes the steps of forming a first mask layer having a first strip portion on a conductor substrate; forming a second mask layer having a second strip portion on the conductor substrate; etching a region of the conductor substrate which is not covered with the first and second mask layers, by using the first and second mask layers as an etching mask, to form a plurality of first recess portions on a surface of the conductor substrate; selectively covering side faces of the plurality of first recess portions, and side faces of the first and second mask layers with a side wall film; selectively removing only the second mask layer, the first mask layer and the side wall film being left unremoved; etching another region of the conductor substrate which is not covered with the first mask layer and the side wall film,

UNITED STATES PATENT AND TRADEMARK OFFICE
CERTIFICATE OF CORRECTION

PATENT NO. : 5,444,267
DATED : August 22, 1995
INVENTOR(S) : Okada et al.

It is certified that error appears in the above-identified patent and that said Letters Patent is hereby corrected as shown below:

by using the first mask layer and the side wall film as an etching mask, to form a plurality of second recess portions on the surface of the conductor substrate; selectively removing part of another region of the surface of the conductor substrate which is not covered with the first mask layer and the side wall film; and removing the first mask layer and the side wall film, to form the plate-like conductor part having the necking portion at the conductor substrate.--.

Column 3, line 46, after the word "conductor",
      insert   --.--.

Column 4, line 56, delete "An", and insert --in--.

Column 5, line 17, delete "An", and insert --in--.

Column 6, line 35, delete "end", and insert --and--.

Column 6, line 58, delete "109", and insert --107--.

UNITED STATES PATENT AND TRADEMARK OFFICE
CERTIFICATE OF CORRECTION

PATENT NO.    : 5,444,267
DATED         : August 22, 1995
INVENTOR(S)   : Okada et al.

It is certified that error appears in the above-identified patent and that said Letters Patent is hereby corrected as shown below:

Column 7, line 20, delete "buying", and insert --having--.

Column 7, line 66, delete "end", and insert --and--.

Column 8, line 36, delete "The", and insert --the--.

Signed and Sealed this

Sixteenth Day of January, 1996

Attest:

BRUCE LEHMAN

*Attesting Officer*    *Commissioner of Patents and Trademarks*